United States Patent
Talty et al.

(10) Patent No.: US 9,537,514 B2
(45) Date of Patent: Jan. 3, 2017

(54) HIGH OVERSAMPLING RATIO DYNAMIC ELEMENT MATCHING SCHEME FOR HIGH DYNAMIC RANGE DIGITAL TO RF DATA CONVERSION FOR CELLULAR COMMUNICATIONS

(71) Applicant: GM GLOBAL TECHNOLOGY OPERATIONS LLC, Detroit, MI (US)

(72) Inventors: Timothy J. Talty, Beverly Hills, MI (US); Zhiwei A. Xu, Malibu, CA (US); Mohiuddin Ahmed, Moorpark, CA (US); Cynthia D. Baringer, Malibu, CA (US); Albert E. Cosand, Agoura Hills, CA (US); James Chingwei Li, Simi Valley, CA (US); Yen-Cheng Kuan, Los Angeles, CA (US); Peter Petre, Oak Park, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 14/744,246

(22) Filed: Jun. 19, 2015

(65) Prior Publication Data
US 2015/0372699 A1   Dec. 24, 2015

Related U.S. Application Data

(60) Provisional application No. 62/015,220, filed on Jun. 20, 2014.

(51) Int. Cl.
| | |
|---|---|
| *H04B 1/44* | (2006.01) |
| *H04B 1/00* | (2006.01) |
| *H03M 3/00* | (2006.01) |

(52) U.S. Cl.
CPC ............ *H04B 1/0003* (2013.01); *H03M 3/338* (2013.01); *H03M 3/408* (2013.01); *H03M 3/466* (2013.01); *H03M 3/502* (2013.01)

(58) Field of Classification Search
USPC   455/78, 438, 118, 90.2, 575.9, 91; 341/143, 144, 155; 375/295
See application file for complete search history.

(56) References Cited

U.S. PATENT DOCUMENTS

| | | | |
|---|---|---|---|
| 6,611,221 B1 | 8/2003 | Soundarapandian et al. | |
| 6,697,003 B1* | 2/2004 | Chen | H03M 1/066 341/143 |
| 7,183,955 B1 | 2/2007 | Shih | |
| 7,508,330 B1* | 3/2009 | Chandra | H03M 1/0663 341/143 |
| 8,154,432 B2 | 4/2012 | Kaper et al. | |
| 2004/0004565 A1* | 1/2004 | Melanson | H03M 7/3006 341/143 |
| 2013/0344819 A1* | 12/2013 | Ozgur | H04B 1/40 455/78 |

* cited by examiner

*Primary Examiner* — Fayyaz Alam
(74) *Attorney, Agent, or Firm* — John A. Miller; Miller IP Group, PLC (57) ABSTRACT

An RF transmitter module for a cellular radio that includes a delta-sigma modulator having a plurality of interleaving dynamic element matching (DEM) circuits providing interleaved digital bits at a reduced clock rate. An interleaver controller controls the DEM circuits so as to provide groups of the digital bits at different points in time. In one embodiment, a summation junction adds the groups of the digital bits to provide a continuous stream of the interleaved digital bits, a DAC converts the stream of interleaved digital bits to an analog signal, and a power amplifier amplifies the analog signal.

20 Claims, 7 Drawing Sheets

HIGH OVERSAMPLING RATIO DYNAMIC ELEMENT MATCHING SCHEME FOR HIGH DYNAMIC RANGE DIGITAL TO RF DATA CONVERSION FOR CELLULAR COMMUNICATIONS

CROSS-REFERENCE TO RELATED APPLICATIONS

This application claims the benefit of the priority date of U.S. Provisional Patent Application Ser. No. 62/015,220, entitled, "High Oversampling Ratio Dynamic Element Matching Scheme for High Dynamic Range Digital to RF Data Conversion for Automotive Cellular Communications", filed Jun. 20, 2014.

BACKGROUND OF THE INVENTION

Field of the Invention

This invention relates generally to an RF transmitter module for a cellular radio that includes a delta-sigma modulator and, more particularly, to an RF transmitter module for a cellular radio that includes a delta-sigma modulator having a plurality of interleaving dynamic element matching (DEM) circuits providing interleaved digital bits at a reduced clock rate.

Discussion of the Related Art

Traditional cellular telephones employ different modes and bands of operations that have been supported in hardware by having multiple disparate radio front-end and baseband processing chips integrated into one platform, such as tri-band or quad-band user handsets supporting GSM, GPRS, etc. Known cellular receivers have integrated some of the antenna and baseband data paths, but nevertheless the current state of the art for mass mobile and vehicular radio deployment remains a multiple static channelizing approach. Such a static architecture is critically dependent on narrow-band filters, duplexers and standard-specific down-conversion to intermediate-frequency (IF) stages. The main disadvantage of this static, channelized approach is its inflexibility with regards to the changing standards and modes of operation. As the cellular communications industry has evolved from 2G to 3G, 4G and beyond, each new waveform and mode has required a redesign of the RF front-end of the receiver as well as expanding the baseband chip set capability, thus necessitating a new handset. For automotive applications, this inflexibility to support emerging uses is prohibitively expensive and a nuisance to the end-user.

Providing reliable automotive wireless access is challenging from an automobile manufacturers point of view because cellular connectivity methods and architectures vary across the globe. Further, the standards and technologies are ever changing and typically have an evolution cycle that is several times faster than the average service life of a vehicle. More particularly, current RF front-end architectures for vehicle radios are designed for specific RF frequency bands. Dedicated hardware tuned at the proper frequency needs to be installed on the radio platform for the particular frequency band that the radio is intended to operate at. Thus, if cellular providers change their particular frequency band, the particular vehicle that the previous band was tuned for, which may have a life of 15 to 20 years, may not operate efficiently at the new band. Thus, this requires automobile manufactures to maintain a myriad of radio platforms, components and suppliers to support each deployed standard, and to provide a path to upgradability as the cellular landscape changes, which is an expensive and complex proposition.

Known software-defined radio architectures have typically focused on seamless baseband operations to support multiple waveforms and have assumed similar down-conversion-to-baseband specifications. Similarly, for the transmitter side, parallel power amplifier chains for different frequency bands have typically been used for supporting different waveform standards. Thus, crucially, receiver front-end architectures have typically been straight forward direct sampling or one-stage mixing methods with modest performance specifications. In particular, no prior application has required a greater than 110 dB dynamic range with associated IP3 factor and power handling requirements precisely because such performance needs have not been realizable with complementary metal oxide semiconductor (CMOS) analog technology. It has not been obvious how to achieve these metrics using existing architectures for CMOS devices, thus the dynamic range, sensitivity and multi-mode interleaving for both the multi-bit analog-to-digital converter (ADC) and the digital-to-analog converter (DAC) is a substantially more difficult problem.

Software-defined radio architectures do not exist in the automotive domain, but have been proposed and pursued in other non-automotive applications, such as military radios with multi-band waveforms. However, in those arenas, because of vastly different waveform needs, conflicting operational security needs and complex interoperability requirements, a zero-IF approach has proven technically difficult. Known software defined radios have typically focused on backend processing, specifically providing seamless baseband operations to support multiple waveforms. The modest performance specifications haven't demanded anything more aggressive from front-end architectures. Straight-forward direct sampling or 1-stage mixing methods have been sufficient in the receiver. For software defined radios that employ delta-sigma modulators, the component function is commonly found after a down conversion stage and has low-pass characteristics. With regard to the transmitter, parallel multiple power amplifier chains to support differing frequency bands and waveform standards have been sufficient for meeting the requirements.

SUMMARY OF THE INVENTION

The present disclosure describes an RF transmitter module for a cellular radio that includes a delta-sigma modulator having a plurality of interleaving dynamic element matching (DEM) circuits providing interleaved digital bits at a reduced clock rate. An interleaver controller controls the DEM circuits so as to provide groups of the digital bits at different points in time. In one embodiment, a summation junction adds the groups of the digital bits to provide a continuous stream of the interleaved digital bits, a DAC converts the stream of interleaved digital bits to an analog signal, and a power amplifier amplifies the analog signal. In an alternate embodiment, a separate DAC receives the digital bits from each DEM circuit and converts the interleaved digital bits to an analog signal, a summation junction adds the analog signal from each of the DACs to provide a combined analog signal, and a power amplifier for amplifying the combined analog signal. In another embodiment, a separate DAC receives the digital bits from each DEM circuit and converts the interleaved digital bits to an analog signal, a separate power amplifier receives and amplifies the analog signal from each of the DACs, and a summation junction adds the analog signals from each of the power amplifiers.

Additional features of the present invention will become apparent from the following description and appended claims, taken in conjunction with the accompanying drawings.

DETAILED DESCRIPTION OF THE EMBODIMENTS

The following discussion of the embodiments of the invention directed to an RF transmitter module for a cellular radio that includes a delta-sigma modulator is merely exemplary in nature, and is in no way intended to limit the invention or its applications or uses. For example, the RF transmitter module of the invention is described as being part of a cellular radio for a vehicle. However, as will be appreciated by those skilled in the art, the RF transmitter module may have other applications other than automotive applications.

Figure 1:
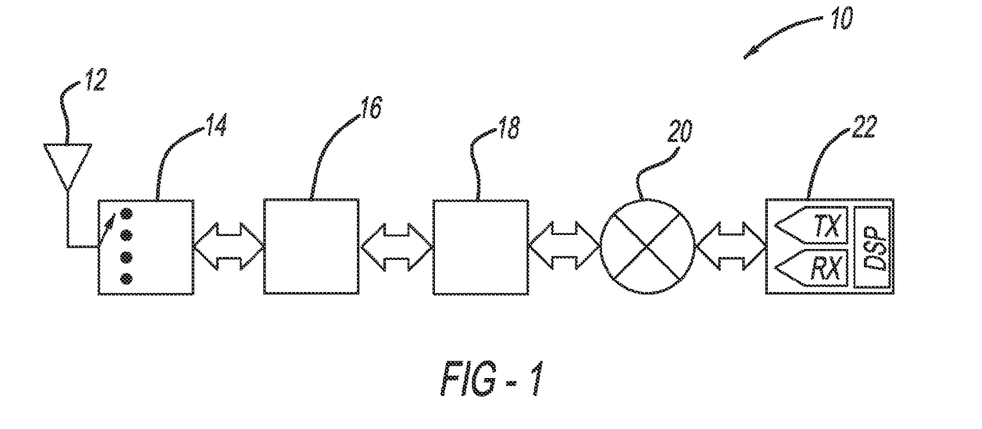
FIG. 1 is a block diagram of a known multi-mode, multi-band cellular communications handset architecture.

FIG. 1 is a block diagram of a known multi-mode, multi-band cellular communications user handset architecture 10 for a typical cellular telephone. The architecture 10 includes an antenna structure 12 that receives and transmits RF signals at the frequency band of interest. The architecture 10 also includes a switch 14 at the very front-end of the architecture 10 that selects which particular channel the transmitted or received signal is currently for and directs the signal through a dedicated set of filters and duplexers represented by box 16 for the particular channel. Modules 18 provide multi-mode and multi-band analog modulation and demodulation of the receive and transmit signals and separates the signals into in-phase and quadrature-phase signals sent to or received from a transceiver 20. The transceiver 20 also converts analog receive signals to digital signals and digital transmit signals to analog signals. A baseband digital signal processor 22 provides the digital processing for the transmit or receive signals for the particular application.

Figure 2:
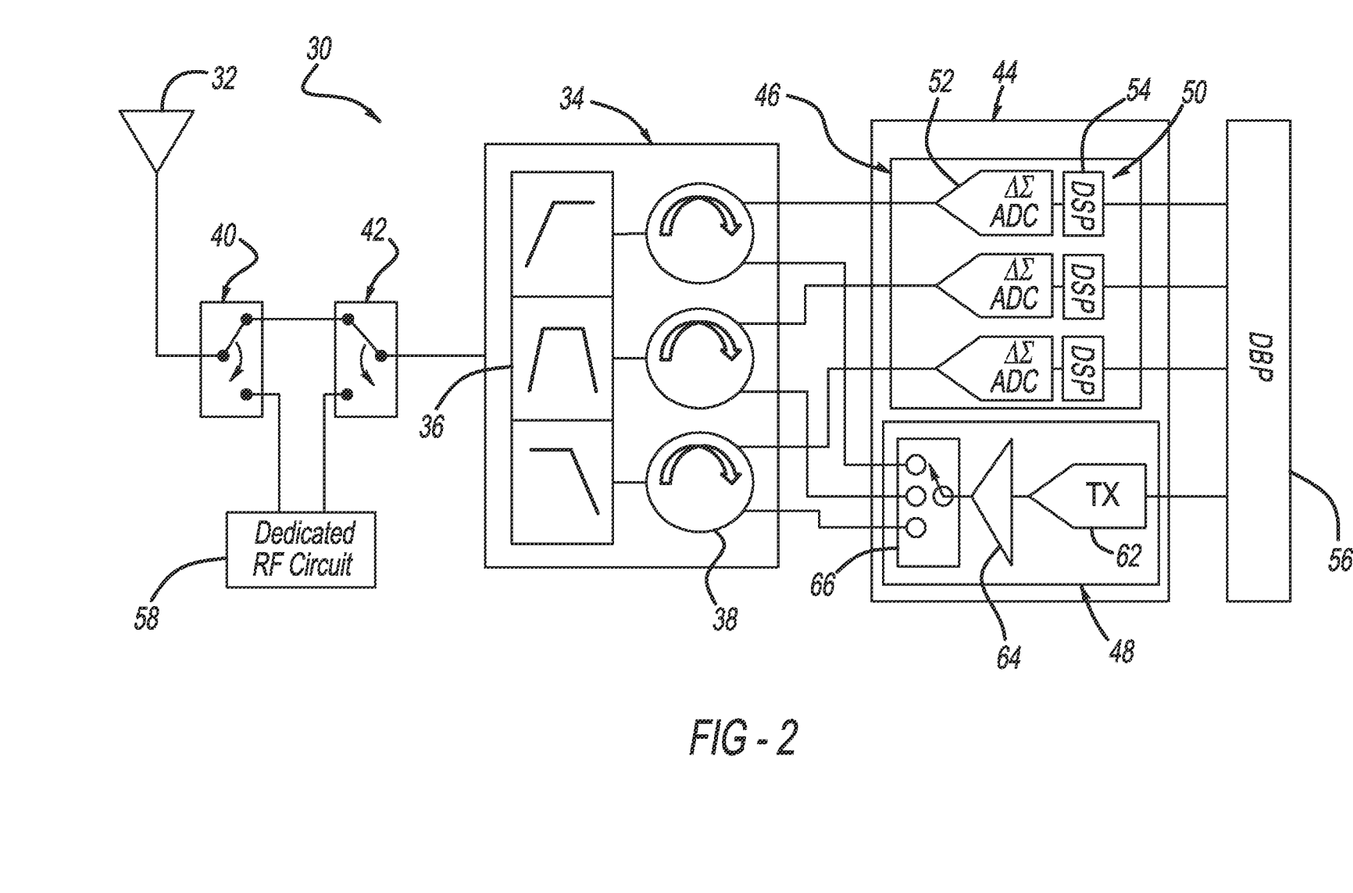
FIG. 2 is a block diagram of a software-programmable cellular radio architecture applicable for automotive uses.

FIG. 2 is a schematic block diagram of a cellular radio front-end architecture 30 that provides software programmable capabilities as will be discussed in detail below. The architecture 30 includes an antenna structure 32 capable of receiving and transmitting the cellular telephone frequency signals discussed herein, such as in a range of 400 MHz-3.6 GHz. Signals received and transmitted by the antenna structure 32 go through a triplexer 34 that includes three signal paths, where each path is designed for a particular frequency band as determined by a bandpass filter 36 in each path. In this embodiment, three signal paths have been selected, however, the architecture 30 could be expanded to other numbers of signal paths. Each signal path includes a circulator 38 that separates and directs the receive and transmit signals and provides isolation so that the high power signals being transmitted do not enter the receiver side and saturate the receive signals at those frequency bands.

The architecture 30 also includes a front-end transceiver module 44 that is behind the triplexer 34 and includes a receiver module 46 that processes the receive signals and a transmitter module 48 that processes the transmit signals. The receiver module 46 includes three receiver channels 50, one for each of the signal paths through the triplexer 34, where a different one of the receiver channels 50 is connected to a different one of the circulators 38, as shown. Each of the receiver channels 50 includes a delta-sigma modulator 52 that receives the analog signal at the particular frequency band and generates a representative stream of digital data using an interleaving process in connection with a number of 4-bit quantizer circuits operating at a very high clock rate, as will be discussed in detail below. As will further be discussed, the delta-sigma modulator 52 compares the difference between the receive signal and a feedback signal to generate an error signal that is representative of the digital data being received. The digital data bits are provided to a digital signal processor (DSP) 54 that extracts the digital data to provide the audio content in the receive signal. A digital baseband processor (DBP) 56 receives and operates on the digital data stream for further signal processing in a manner well understood by those skilled in the art. The transmitter module 48 receives digital data to be transmitted from the processor 56. The module 48 includes a transmitter circuit 62 having a delta-sigma modulator that converts the digital data to an analog signal to be amplified by a power amplifier 64, as will be discussed in detail below. The amplified analog signal from the power amplifier 64 is then sent to a switch 66 that directs the signal to the particular circulator 38 in the triplexer 34 depending on which frequency is being transmitted.

As will become apparent from the discussion below, the configuration of the architecture 30 provides software programmable capabilities through high performance delta-sigma modulators that provide optimized performance in the signal band of interest and that can be tuned across a broad range of carrier frequencies. The architecture 30 meets current cellular wireless access protocols across the 0.4-2.6 GHz frequency range by dividing the frequency range into three non-continuous bands. However, it is noted that other combinations of signal paths and bandwidth are of course possible. The triplexer 34 implements frequency domain de-multiplexing by passing the RF carrier received at the antenna structure 32 into one of the three signal paths. Conversely, the transmit signal is multiplexed through the triplexer 34 onto the antenna structure 32. For vehicular wireless access applications, such a low-cost integrated device is desirable to reduce parts cost, complexity, obsolescence and enable seamless deployment across the globe.

The circulators 38 route the transmit signals from the transmitter module 48 to the antenna structure 32 and also provides isolation between the high power transmit signals and the receiver module 46. Although the circulators 38 provide significant isolation, there is some port-to-port leakage within the circulator 38 that provides a signal path between the transmitter module 48 and the receiver module 46. A second undesired signal path occurs due to reflections from the antenna structure 32. As a result, a portion of the transmit signal will be reflected from the antenna structure 32 due to a mismatch between the transmission line impedance and the antenna's input impedance. This reflected energy follows along the same signal path as the incoming desired signal back to the receiver module 46. The impact of this imperfect isolation and antenna reflection has traditionally been resolved through the use of static surface acoustic wave (SAW) or bulk acoustic wave (BAW) filters. However, these types of filters are generally employed for fixed frequencies and do not support a reconfigurable radio architecture.

The delta-sigma modulators 52 are positioned near the antenna structure 32 so as to directly convert the RF receive signals to bits in the receiver module 46 and bits to an RF signal in the transmitter module 48. The main benefit of using the delta-sigma modulators 52 in the receiver channels 50 is to allow a variable signal capture bandwidth. This is possible because the architecture 30 enables software manipulation of the modulator filter coefficients to vary the signal bandwidth and tune the filter characteristics across the RF band, as will be discussed below.

The architecture 30 allows the ability to vary signal capture bandwidth, which can be exploited to enable the reception of continuous carrier aggregated waveforms without the need for additional hardware. Carrier aggregation is a technique by which the data bandwidths associated with multiple carriers for normally independent channels are combined for a single user to provide much greater data rates than a single carrier. Together with MIMO, this feature is a requirement in modern 4G standards and is enabled by the OFDM family of waveforms that allow efficient spectral usage.

The architecture 30 through the delta-sigma modulators 52 can handle the situation for precise carrier aggregation scenarios and band combinations through software tuning of the bandpass bandwidth, and thus enables a multi-segment capture capability. Dynamic range decreases for wider bandwidths where more noise is admitted into the sampling bandpass. However, it is assumed that the carrier aggregation typically makes sense when the user has a good signal-to-noise ratio, and not cell boundary edges when connectivity itself may be marginal. Note that the inter-band carrier aggregation is automatically handled by the architecture 30 since the triplexer 34 feeds three independent modulators in the channels 50.

The architecture 30 is also flexible to accommodate other wireless communications protocols. For example, a pair of switches 40 and 42 can be provided that are controlled by the DSP 56 to direct the receive and transmit signals through dedicated fixed RF devices 58, such as a GSM RF front end module or WiFi FEM. In this embodiment, some select signal paths are implemented via conventional RF devices. FIG. 2 only shows one additional signal path, however, this concept can be expanded to any number of additional signal paths depending on use cases and services.

Figure 3:
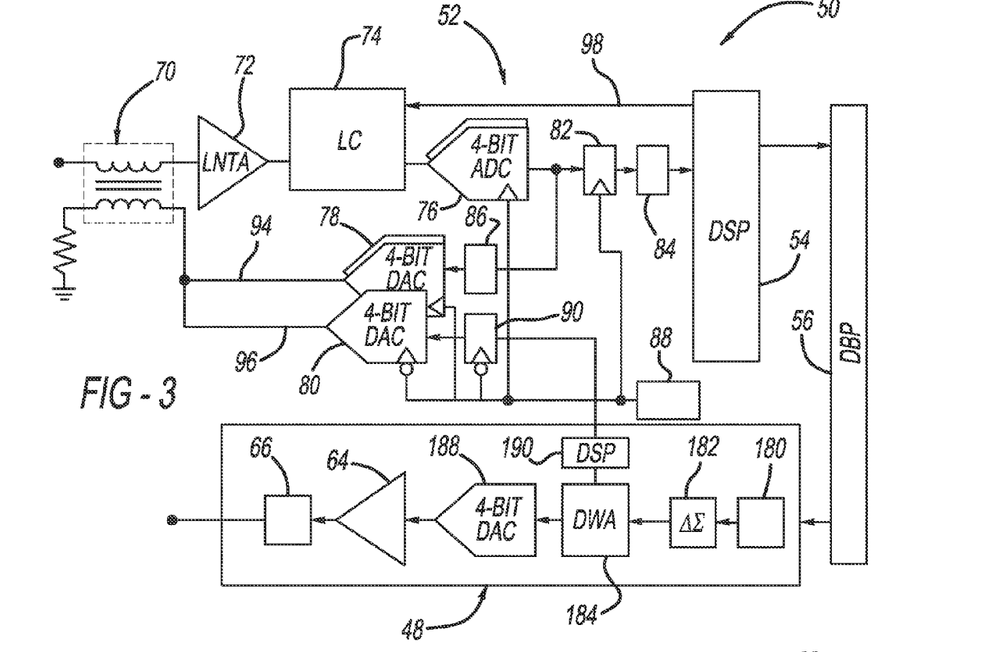
FIG. 3 is a block diagram of a receiver channel for the radio architecture shown in FIG. 2 including a delta-sigma modulator showing interleaver quantizers and a transmitter module.

FIG. 3 is a schematic block diagram 68 of a portion of the architecture 30 including one of the receiver channels 50 having the delta-sigma modulator 52 and the DSP 54, the transmitter module 48 and the baseband processor 56. The receive signals from the circulator 38 at node 92 are provided to a broadband combiner 70 operating as a summation junction. A receive feedback signal on line 94 and a transmitter cancellation signal on line 96 are also provided to the combiner 70 and are subtracted from the receive signal to generate an analog error signal that is sent to a low noise transconductance amplifier (LNTA) 72. The amplified error signal is provided to a sixth-order LC filter 74, where the filter 74 operates as a bandpass filter to reshape the noise in the analog error signal so that it is out of the desired signal band, thus obtaining quality signal-to-noise and distortion performance.

In low-pass or low-IF bandwidth modular designs having a faster clock rate means a higher oversampling ratio (OSR), i.e., the ratio of the clock speed to twice the signal bandwidth, which means better dynamic range. In a high-RF bandpass design, the clock rate is constrained by the clock-to-carrier ratio. For a sampling rate to RF carrier frequency ratio less than four, the digital filter becomes substantially more complicated. To meet cellular standards in the high receive band up to 2.6 GHz, a clock rate of 10.4 GHZ would be required. However, for these clock rates, achieving 100 dB of dynamic range in the analog feedback signal to the combiner 70 is unrealistic. To address this challenge, the present invention provides interleaved quantizer circuits to reduce the clock rate to 5.2 GHz. The quantizer circuits are clocked at half rate, but the achieved clock rate is still 10.4 GHz, which has the advantage of maintaining a large OSR greater than 512 for a 20 MHz signal band, but making stability more challenging since the feedback delay is relative to the effective clock period it is easier to exceed a threshold for stability.

Based on this discussion, the filtered error signal from the filter 74 is provided to a series of multi-bit ADCs 76, such as two or more ADCs with three or four-bit resolution, that convert the error signal to a digital signal in an interleaving manner at the output of the ADC 76. Interleaving as used herein means that the analog carrier frequency from the filter 74 is processed in separate sections by the plurality of the ADCs 76 so that the rate at which the conversion process is being performed can be reduced. Those bits are sent to a series of multi-bit DACs 78 having, for example, three or four-bit resolution in the feedback line 94, where the combination of each pair of the ADC 76 and the DAC 78 is a quantizer circuit that operates as a 4-bit interleaver on multiple groups of 4-bits, as will be discussed in further detail below. A bit resolution of four was chosen to balance the challenge in design of the LNTA 72 and the feedback DACs 78. An upper bound on the number of bits is set by the ability to design the DAC 78 to meet the dynamic range of the system. Unlike the 4-bit ADC that is in the forward path of the modulator 52, the non-linearities of the DAC 78 are not shaped by the filter 74 and directly affect the performance. The interleaving process provides the groups of 4-bits from the ADCs 76 through a data weighted averaging (DWA) digital shaper circuit 86 before being provided to the 4-bit DACs 78. Because interleaving allows the sampling rate to be reduced oversampling to maintain bit integrity is not required. Thus the bit resolution is four, but each pair of the ADCs 76 and the DACs 78 in the quantizer circuit need only operate at half-speed making it easier to meet dynamic range requirements.

Interleaving both the multi-bit ADC 76 and DAC 78 as proposed herein is a substantially harder problem than addressed in the prior art. Meeting dynamic range goals requires matching among the interleaved ADCs 76 and the DACs 78 in addition to managing mismatch within an individual DAC. Also, interleaving increases the excess phase delay in the loop and requires compensation to maintain stability. The clock rates in delta-sigma ADC designs used herein are typically as fast as possible without degrading the modulator performance by introducing jitter into the system.

Figure 4:
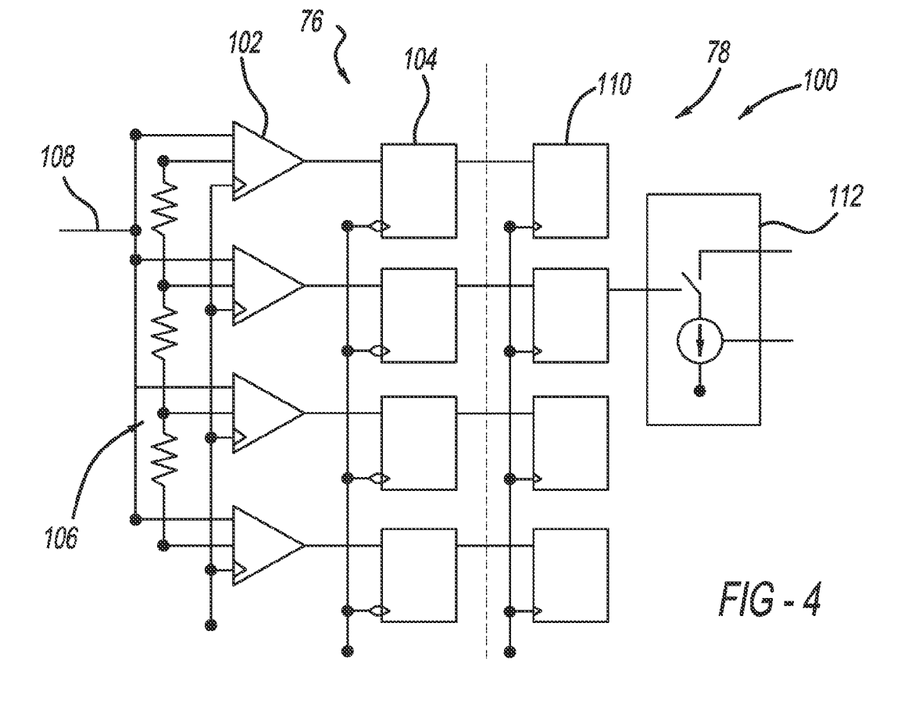
FIG. 4 is a schematic diagram of a 4-bit quantizer employed in the delta-sigma modulator shown in FIG. 3.

FIG. 4 is a schematic diagram of a quantizer circuit 100 defined by one group of the ADCs 76 and the DACs 78. The ADC 76 and the DAC 78 include a bit path for each bit in the 4-bit quantizer. Each signal path in the ADC 76 includes a comparator 102 and a latch 104. A voltage divider network 106 sets a different reference voltage for each of the comparators 102 in each of the signal paths. The analog signal from the filter 74 is provided on line 108 and is sent to each of the comparators 102. If that voltage level is above the reference level for the particular comparator 102, then the latch 104 for that channel is set high for that bit. The DAC 78 includes latches 110 that reset the bits back to an analog signal through a switch 112.

Delta-sigma modulators are a well known class of devices for implementing analog-to-digital conversion. The fundamental properties that are exploited are oversampling and error feedback (delta) that is accumulated (sigma) to convert the desired signal into a pulse modulated stream that can subsequently be filtered to read off the digital values, while effectively reducing the noise via shaping. The key limitation of known delta-sigma modulators is the quantization noise in the pulse conversion process. Delta-sigma converters require large oversampling ratios in order to produce a sufficient number of bit-stream pulses for a given input. In direct-conversion schemes, the sampling ratio is greater than four times the RF carrier frequency to simplify digital filtering. Thus, required multi-GHz sampling rates have limited the use of delta-sigma modulators in higher frequency applications. Another way to reduce noise has been to use higher order delta-sigma modulators. However, while first order canonical delta-sigma architectures are stable, higher orders can be unstable, especially given the tolerances at higher frequencies. For these reasons, state of the art higher order delta-sigma modulators have been limited to audio frequency ranges, i.e., time interleaved delta-sigma modulators, for use in audio applications or specialized interleaving at high frequencies. The present invention improves upon prior approaches through the sixth-order filter 74 with the 4-bit feedback structure for maximum flexibility in the noise shaping characteristics. The modulators 52 can achieve a dynamic range of 100 dB over a signal bandwidth of 20 MHz across an RF bandwidth of 400 MHz.

A decoder 82 receives the 4-bit sequence from all of the ADCs 76 simultaneously and reconfigures the bits in the proper orientation to be output as a serial data stream. The bits are then provided to a de-multiplexer 84 to provide the data stream at the lower clock rate. Particularly, the output data bits from the ADCs 76 are decoded from thermometer code to binary code and de-multiplex down to a data rate that can be supported by the DSP 54. Operational parameters for the filter 74 are set by the DSP 54 and are provided on line 98. Also, a calibration phase is performed to optimize the performance for the receive channel 50. A clocking device 88 provides the clock signals to the various components in the modulator 52, as shown, where the frequency of the clock rate determines power consumption and semiconductor material as will be discussed in further detail below.

Figures 5, 7:
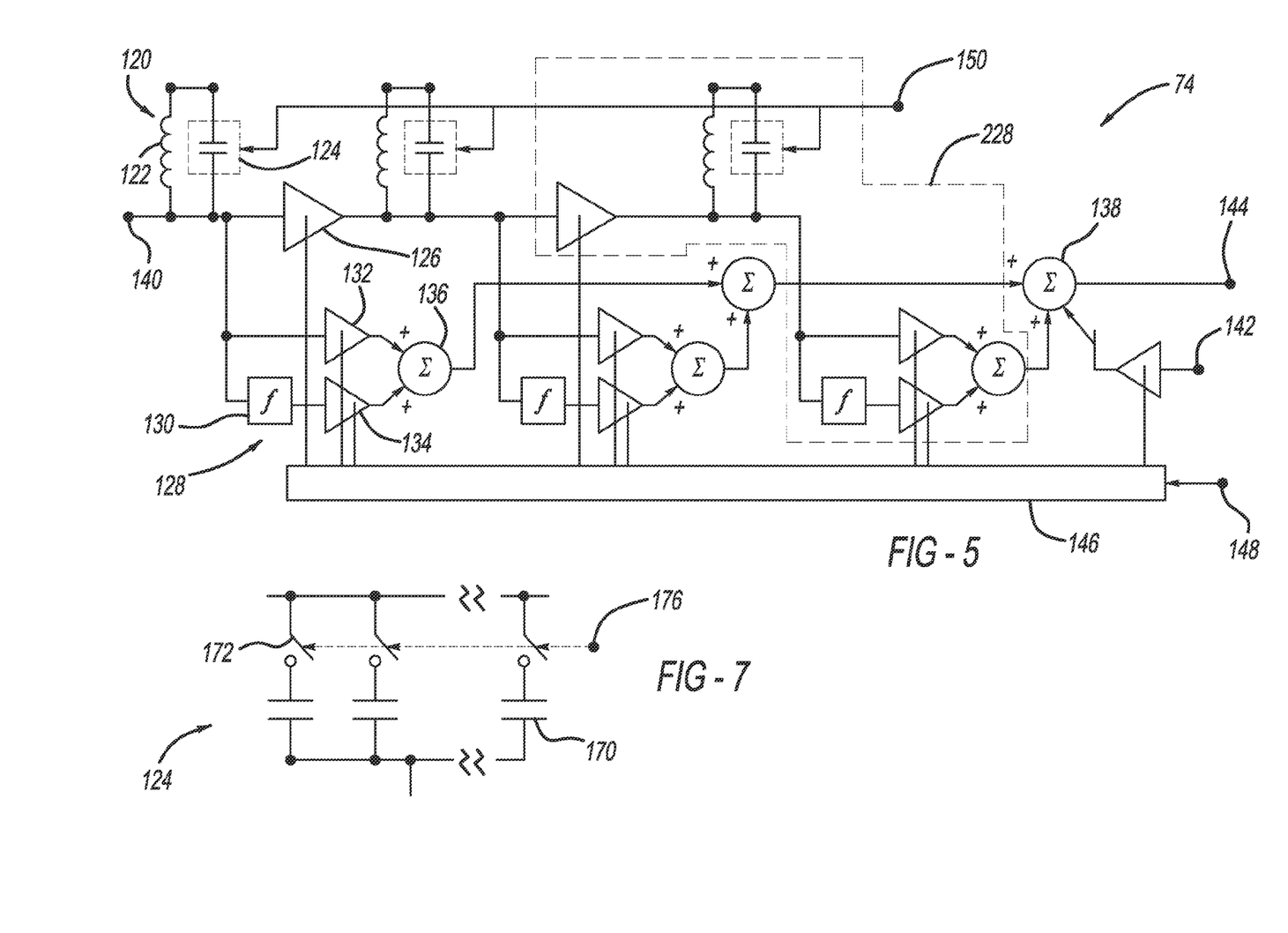
FIG. 5 is a schematic block diagram of the sixth-order filter employed in the delta-sigma modulator shown in FIG. 3.
FIG. 7 is a capacitor array providing course and fine tuning employed in one of the resonators in the sixth-order filter shown in FIG. 5.

FIG. 5 is a schematic diagram of the sixth-order filter 74 that includes three passive LC resonator circuits 120 each including an inductor 122 and a capacitor array 114. As is well understood by those skilled in the art, the number of orders of a particular filter identifies the number of poles, where the number of poles defines the number of LC circuits. Filtering and correction algorithms are applied to the digital output stream in the DSP 54. Low-speed tuning and calibration signals are fed back into the filter 74 on the line 98 for reconfiguring and optimizing the filter 74. The filter 74 also includes a series of transconductance amplifiers 126 in the primary signal path. A feed-forward path provides stability and includes integrator circuits 128 each including an integrator 130, two tuneable transconductance amplifiers 132 and 134 and a summer 136. The filter 74 has a feed-forward architecture where signals are fed from early resonator stages into a final summing junction 138. The signal from the LTNA 72 is provided at node 140, and the most significant bit of the 4-bit DAC 78 in the feedback loop on the line 94 is provided at node 142. The output of the filter 74 is provided to the 4-bit ADCs 76 at node 144. A low-speed DAC array 146 receives coefficient control bits at node 148 from the line 98 to control the functions in the integrator circuits 128. Frequency control bits from the DSP 54 on the line 98 are provided to the capacitor array 124 at node 150.

Although a feedback architecture may offer more out-of-band noise shaping, a feed-forward architecture gives more flexibility in designing a stable modulator. The passive resonator circuits 120 are employed because they have lower noise figures, higher linearity, require less power, and can operate at higher carrier frequencies than active resonators. The quality factor Q of the resonator circuits 120 is primarily set by the series resistance in the inductor 122. Simulations have shown that the resonator Q should be greater than 30 to achieve a deep notch characteristic and will require an off-chip component as it is difficult to achieve the needed performance with an integrated spiral inductor. Simulations also have shown that five sets of coefficients are needed to cover a 400 MHz RF band and the modulator 52 is stable across 100 MHz band, but an extra set allows for frequency overlap. The coefficient set information will be stored in a look-up table in the DSP 54. Control bits will be loaded and sent to the filter 74 to set the notch frequency and component parameters based on RF carrier information.

Figure 6:
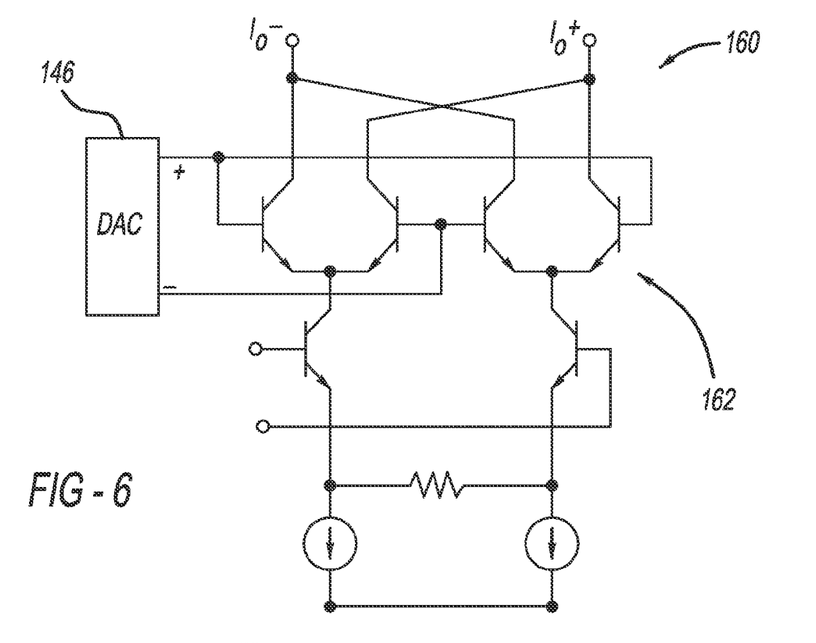
FIG. 6 is a schematic diagram of a tuneable transconductance amplifier employed in the sixth-order filter shown in FIG. 5.

FIG. 6 is a schematic diagram of an amplifier circuit 160 implemented in the transconductance amplifiers 126 to show how the coefficients may be adjusted. The gain of the transconductance amplifiers 126 may be varied by applying a differential voltage to a cross-coupled pair of transistors 162. When the differential voltage is zero, there is no gain. For a large positive differential voltage, the amplifier 126 achieves a maximum positive gain and, conversely, for large negative differential voltage, the transconductance gain is maximized and inverted. The differential voltages are converted from the DSP control bits using the low-speed DAC array 146.

The inductors 122 will be fixed for each of the three RF bands in the signal paths through the triplexer 34 and the capacitance changed within each band through the capacitor array 124. The size, or more appropriately, the resolution of the capacitor array 124 will be fine enough for narrow frequency selectivity. FIG. 7 is a schematic diagram of one possible embodiment for the capacitor array 124 that provides coarse and fine tuning. The capacitor array 124 includes a plurality of capacitors 170 and switches 172, where the switches 172 are selectively controlled by the frequency notch control signal from the DSP 54 at node 176.

The order of the filter 74, the ratio of the sample rate to signal bandwidth and the number of bits in the quantizer circuit 100 are all chosen to achieve a 100 dB dynamic range. The passive resonator circuits 120 with the inductors 122 and the capacitor arrays 124 offer lower-power and wider bandwidth operation. Post-processing, such as filtering, calibration and correction of the output digital data is performed in the DSP 54. The modulators 52 are able to meet the dynamic range requirements by reducing the magnitude of the unwanted transmit signal.

Additional corrections are provided on the feedback line 96 for reducing a potential interfering signal from the transmitter module 48 including a 4-bit delta-sigma DAC 80 to replicate the transmit signal from a digital data stream and subtracted from the input in the combiner 70. If a transmit signal is occurring in the same frequency range through the same circulator 38 while the delta-sigma modulator 52 is receiving a receive signal on that channel, the transmit signal is also fed back to the combiner 70 through the delta-sigma DAC 80. The bit sequence for the transmit signals provided by the transmitter module 48 is sent through a latch 90 that latches the bits into the DAC 80.

The adaptive cancellation technique leverages the fact that the digital sequence for creating the transmit signal is available and uses the inherent feedback path of the modulator 52. The transmit digital data from the baseband processor 56 is a modified sequence of the actual transmitted signal and has been altered based on the changing environment so that the replicated transmit signal, particularly the phase and strength, is a better approximation to the unwanted signal arriving at the receiver input. The modified transmit data sequence is then converted to an analog signal through the 4-bit replica DAC 80. The amount of cancellation needed is determined by the linearity specification of the LNTA 72.

For a transmit power level of 25 dBm the reflected signal from the antenna structure 32 into the receiver module 46 will be approximately 14 dBm, where a 3:1 VSWR and 1 dB cable loss are assumed. In traditional delta-sigma modulator designs, the combiner 70 comes after the LNTA 72. In a traditional architecture where the LNTA 72 is in front of the combiner 70, the input intercept point of the LNTA 72 would have to be 64 dBm to reach 100 dB of dynamic range. Since the LNTA 72 must also achieve a noise figure of less than 2.5 dB, this design is not feasible. The dynamic range of the receiver module 46 is heavily challenged by having to detect a very weak desired signal in the presence of the radios large transmitted signal. Less than ideal antenna reflections and imperfect transmit-to-receive isolation may present a fairly large transmitted signal at a frequency near the smaller desired signal frequencies.

If the combiner 70 precedes the LNTA 72, then the signal presented to the LNTA 72 is the delta between the input signal and its quantized estimate. Reducing the signal level into the LNTA 72 eases the linearity requirements on the system for potentially higher dynamic range in the overall modulator. The error is reduced by 6 dB for every bit in the feedback DAC 78. The present invention proposes features for enhancing linearity in the delta-sigma modulator 52 including having the combiner 70 precede the LNTA 72 and using an adaptive cancellation scheme to attenuate the interfering transmitted signal as discussed. Swapping the order of the combiner 70 and the LNTA 72 and using the 4-bit feedback DACs 78, the input into the LNTA 72 is reduced to −10 dBm. The required amount of cancellation from the adaptive scheme needs to be at least 15 dB to reduce the design requirements on the LNTA 72 to an achievable P3 of 25 dBm.

For the cellular application discussed herein that covers multiple assigned frequency bands, a transmitter with multi-mode and multi-band coverage is required. Also, many current applications mandate transmitters that rapidly switch between frequency bands during the operation of a single communication link, which imposes significant challenges to typical local oscillator (LO) based transmitter solutions. This is because the switching time of the LO-based transmitter is often determined by the LO channel switching time under the control of the loop bandwidth of the frequency synthesizer, around 1 MHz. Hence, the achievable channel switching time is around several microseconds, which unfortunately is too long for an agile radio. A fully digital PWM based multi-standard transmitter, known in the art, suffers from high distortion, and the channel switching time is still determined by the LO at the carrier frequency. A DDS can be used as the LO sourced to enhance the switching speed, however, this design consumes significant power and may not deliver a high frequency LO with low spurious components. Alternately, single sideband mixers can be used to generate a number of LOs with different center frequencies using a common phase-lock loop (PLL), whose channel switching times can be fast. However, this approach can only support a limited number of LO options and any additional channels to cover the wide range of the anticipated 4G bands would need extra mixtures. As discussed, sigma-delta modulators have been proposed in the art to serve as an RF transmitter to overcome these issues. However, in the basic architecture, a sigma-delta modulator cannot provide a very high dynamic range in a wideband of operations due to a moderate clock frequency. It is precisely because the clock frequency is constrained by current technology that this high frequency mode of operations cannot be supported.

Returning to FIG. 3, the transmitter module 48 includes a multiplexer 180 that receives the digital data to be transmitted from the baseband processor 56 and a delta-sigma modulator 182 that modulates the bits in the manner as discussed herein. The modulated bits are then provided to a DWA circuit 184 and the bits are converted to an analog signal by a 4-bit DAC 188. The analog signal is then amplified by the power amplifier 64 and switched into the appropriate signal path in the triplexer 34 by the switch 66. A DSP 190 receives a signal from the DWA circuit 184 to provide a representation of the transmit signal to the DAC 80 for signal cancellation in the combiner 70 as discussed above. The multiplexer 180, the delta-sigma modulator 182, the DWA circuit 184, the DAC 188 and the DSP 190 are all part of the transceiver circuit 62.

Figure 8:
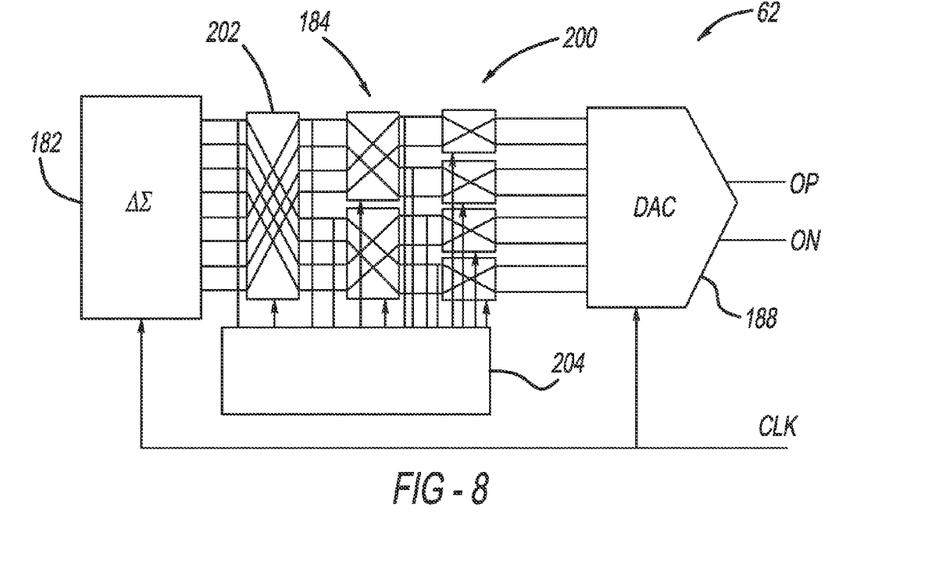
FIG. 8 is a schematic block diagram of a digital bandpass delta-sigma modulator for the transmitter module shown in FIG. 3.

FIG. 8 is a schematic block diagram 200 of a portion of the transmitter module 48 showing the delta-sigma modulator 182, the DWA circuit 184 and the DAC 188. The DWA circuit 184 modulates the digital thermal codes to shape out voltage and timing mismatches among DAC weighting elements 202 that are controlled by a shape controller 204. The weighted digital bits are then provided to the 4-bit DAC 188 that generates the analog signal to be transmitted.

The delta-sigma modulator 182 employed as an RF transmitter provides digital data that can be generated by a high speed processor or can be produced by a multi-rate digital signal processor. The interleaving architecture effectively increases the clock rate of the delta-sigma modulator, boosts the oversampling ratio, and in turn improves the achievable signal-to-noise ratio and dynamic range. In order to enable this interleaving architecture, an interleaving dynamic element matching (DEM) algorithm must be employed. Unlike conventional DEM algorithms that arrange the cells in one DAC, the interleaving DEM algorithm considers the used cells in all of the interleaving DACs, and arranges them to ensure there is no periodic pattern when using the cell.

Figure 9:
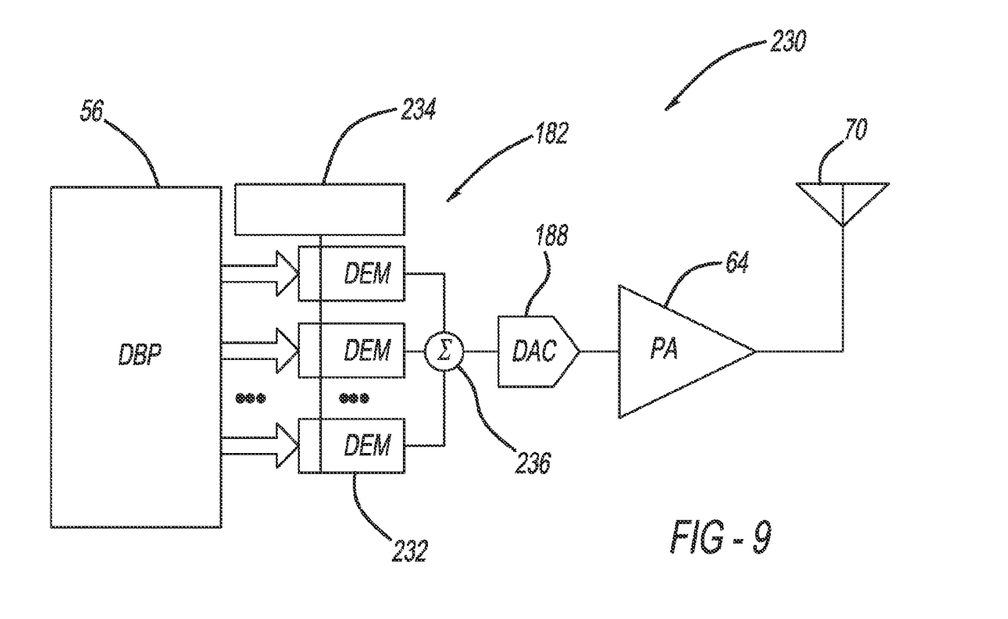
FIGS. 9-11 show three embodiments of a delta-sigma modulator employing an interleaving DEM algorithm for the transmitter module of the radio architecture shown in FIG. 3.

FIG. 9 is a schematic block diagram 230 of a portion of the transmitter module 48 showing the delta-sigma modulator 182, the DAC 188, and the power amplifier 64 illustrating an interleaving architecture. The DWA circuit 184 is not shown for clarity purposes. The digital signal to be transmitted from the baseband processor 56 is provided to a number of DEM circuits 232 in the delta-sigma modulator 182 to provide the dynamic element matching control provided by an interleaving control processor 234 at the slower clock rate. The signals are combined by a summer 236 and sent to the DAC 188 and then to the power amplifier 64. The DEM algorithm operating in the circuits 232 does not run at the highest clock rate, but instead the computation is distributed into the multiple circuits 232 running at a slower clock rate. The digital data is then multiplexed into one high speed data stream and fed into high speed data followed by the power amplifier 64.

Figure 10:
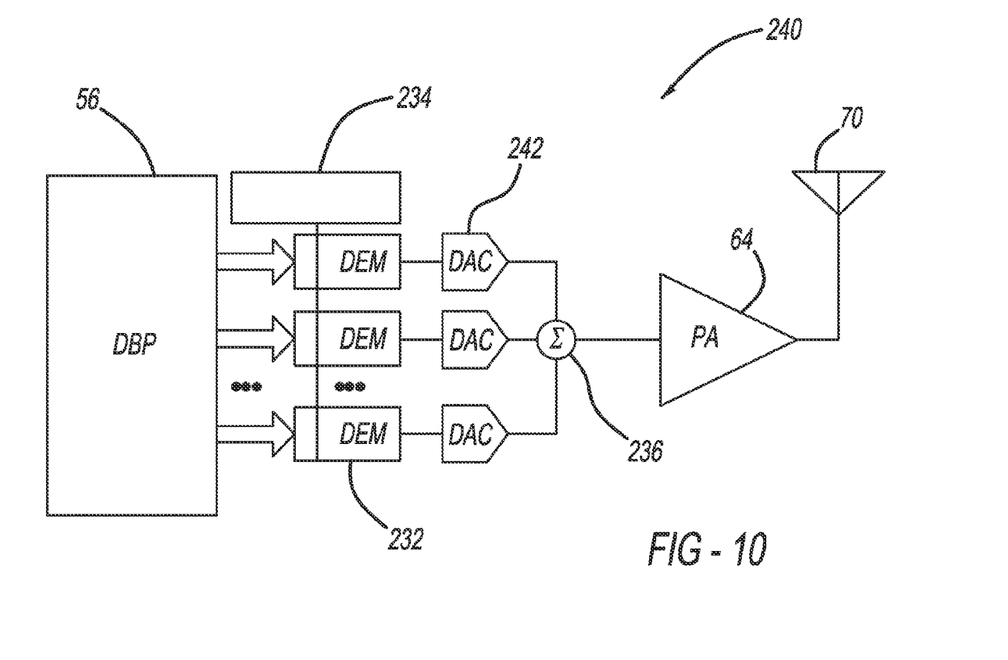

FIG. 10 is a schematic block diagram 240 of a portion of the transmitter module 48 that can replace the block diagram 230, where like elements are identified by the same reference number. In this design, three separate DACs 242, one for each of the DEM circuits 232, replace the DAC 188, where the summation junction 236 is provided after the DACs 242.

Figure 11:
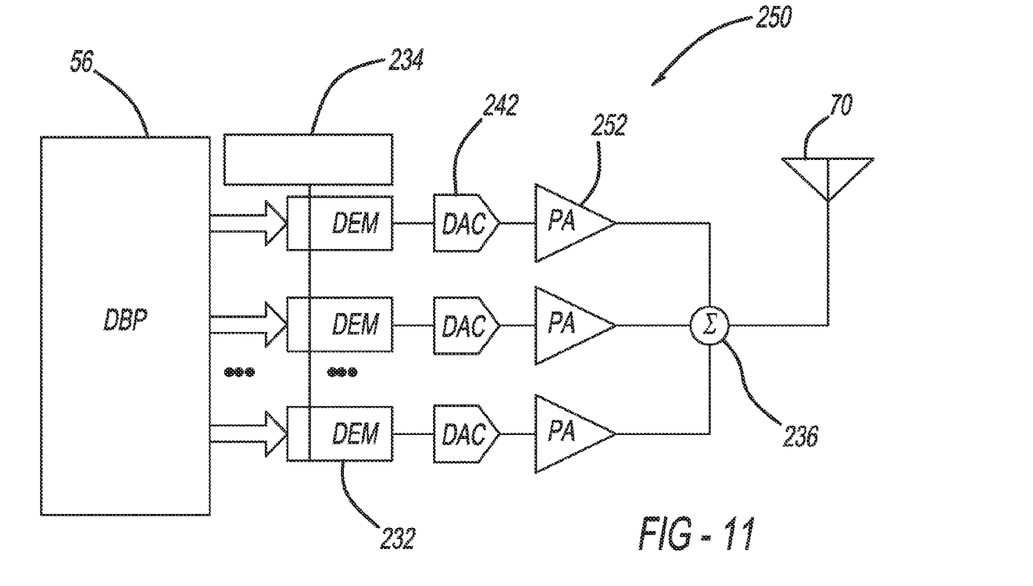

FIG. 11 is a schematic block diagram 250 of a portion of the transmitter module 48 that can replace the block diagram 240, where like elements are identified by the same reference number. In this design, three separate power amplifiers 292, one for each of the DEM circuits 232, replace the power amplifier 64.

The architecture 30 is designed to achieve 100 dB of dynamic range over 20 MHz signal band and RF carrier frequencies up to 2.6 GHz. The modulators 52 must be capable of detecting a small desired signal, such as −86 dBm, in the presence of a large unwanted interference signal, such as 14 dBm. However, when the operating scenario does not demand as much from the hardware, i.e., smaller signal bandwidths, the power dissipation in the transmitter module 48 should be reduced. There are two primary approaches for adjusting power dissipation including reducing functionality or reducing performance. Reducing functionality is a matter of reconfiguring the architecture to bypass or disable unneeded circuitry. Reducing performance includes modifying the architecture 30 to operate with decreased supply current or voltage thereby trading off performance for power. As will be discussed below, the present invention proposes several techniques in both of these categories that may be used to reduce power in the software-programmable cellular radio as discussed herein.

A first power reduction technique includes reducing the order of the filter 74 in situations where full dynamic range is not required. Particularly, the sixth-order LC filter 74 can be reduced to a fourth-order or a second-order filter by powering down following resonator stages. For example, by disabling the last group of the resonator circuit 120, the amplifier 126 and the integrator circuit 128, represented by dotted box 228 in FIG. 5, would reduce the filter 74 from a sixth-order filter to a fourth-order filter. A separate power supply may be used to completely shut down some circuitry while other circuitry could remain on, but at minimal power consumption.

A second power reduction technique is to reduce the bit resolution of the quantizer circuit 100 from 4-bits to one bit. For this power reduction technique, only one of the bits in the 4-bit quantizer circuit 100 is employed to reduce power. For example, a center one of the comparators 102 in the circuit 100 determines the zero cross-over point and is required for the one-bit operation. All of the other comparators 102 and most of the latches 104 and 110 may be turned off. All of the DAC current switches must remain active and be driven by the most significant bit (MSB) path to keep the modulator stable. For either the one-bit or the 4-bit operation, the tail currents in the switches may be decreased when the receive signal is not large, such as when the radio is not transmitting.

Varying the clock rate to reduce static power dissipation is another proposed technique to reduce power consumption. The impact on the delta-sigma ADC architecture for this technique includes that at a slower clock rate the quantizer circuits do not need to be interleaved, and fewer stages of de-multiplexing is required. The only reason interleaving is provided is to support fast sampling rates for high RF carrier frequencies. At lower RF carrier frequencies, the clock rate may be reduced and the interleaved quantizers disabled. If the clock rate is sufficiently slow, a one-to-two (1×2) demultiplexer may be all that is needed to interface with the DSP 54 as will be described below.

Figure 12:
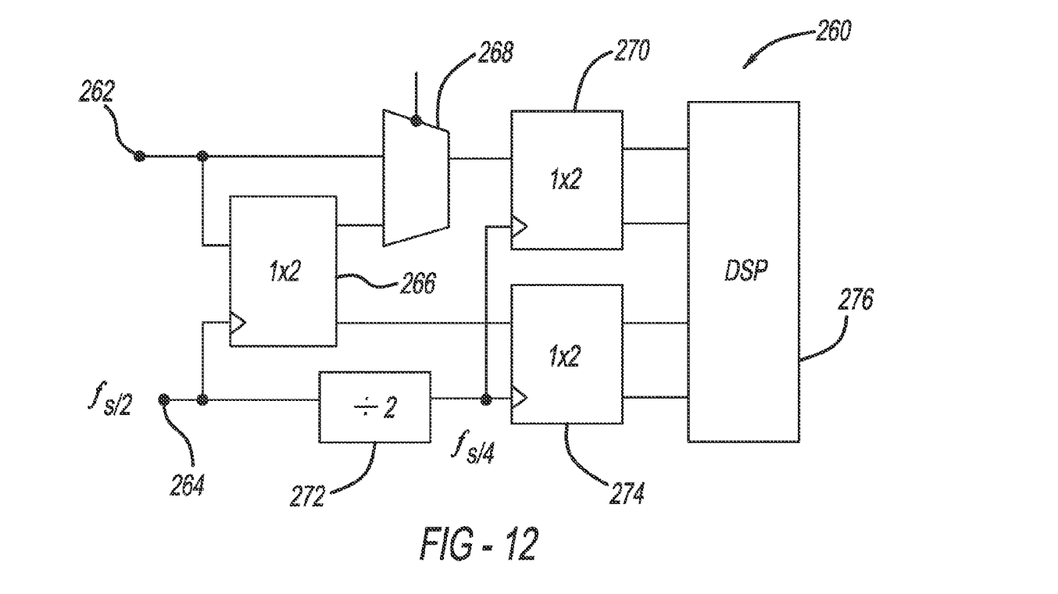
FIG. 12 is a schematic diagram of a timing circuit that can be employed in the delta-sigma modulator shown in FIG. 3.

FIG. 12 is a schematic block diagram of a 1×4 demultiplexer circuit 260 that can be reconfigured as a 1×2 demultiplexer circuit to reduce power dissipation for slower clock rate operation the clock rate in the manner discussed herein. The demultiplexer circuit 260 receives the data to be clocked in at node 262 and a one-half divided clock signal at node 264. The data is provided to a 1×2 demultiplexer 266 and a selector 268, where the demultiplexer 266 is clocked at the one-half clock signal. The selector 268 selects the normal data at the node 264 or the demultiplexed data from the demultiplexer 266, and outputs the selected data to a 1×2 demultiplexer 270. The one-half clock signal at the node 264 is divided by two by a divider 272 to generate a one-fourth clock signal that clocks the demultiplexer 270 and a demultiplexer 274. Outputs from the demultiplexers 270 and 274 are provided to a DSP 276. When the normal data is selected, the demultiplexers 266 and 274 need not be powered.

In other power-saving techniques, the present invention proposes trading performance for power consumption in relaxed operation scenarios. As an example, in a maximum performance mode the intercept point of the LNTA 72 has about a 25 dBm to support 100 dB of dynamic range while achieving a low-noise figure. If the constraint on linearity or noise can be eased, then a substantial amount of power can be saved. Two scenarios are considered to accomplish this. In the first scenario, the receive signal is well above the noise floor and the required dynamic range is less. In the second scenario, there is no unwanted transmitted signal so the maximum expected input level will be lower. In both scenarios there is a relief in design for a high third-order intercept point that can be translated to reduced current, supply voltage or both.

Performance may also be traded for power savings in the DACs 78. Since errors in the DAC 78 are not shaped by the filter 74, the DAC performance must equal or exceed the modulator performance. To achieve this performance, dynamic element matching provided by the DEM circuits 232 is incorporated in the DAC design as discussed above.

Mismatches among nominally identical circuit elements inevitably introduced during circuit fabrication cause non-linear distortion. By scrambling the usage pattern of the elements, the DEM circuits 232 cause the error resulting from the mismatches to be pseudo-random noise that is uncorrelated with the input sequence instead of non-linear distortion. If operation conditions require less dynamic range, a lower-power simplified scrambler would be sufficient.

Another proposed method for programmable power efficiency in the radio architecture 30 includes disabling the transmit cancellation scheme. The cancellation scheme is implemented in part by the 4-bit DAC 80 for reducing self-interference. Cancellation is only necessary if the transmit signal is in an adjacent band, is at full output power, and the reflection from the antenna structure 32 is poor. Under these conditions, there must be cancellation so that the modulator 52 can linearly process this unwanted interference as it appears at the receiver module 46 so that the DSP function can process it further. The delta-sigma modulator 52 may be programmed to employ any combinations of the techniques for optimizing power efficiency in the transmitter of an automotive wireless cellular communications system. An important scenario is when the transceiver module 44 is in an idle state and all of the power-saving techniques are in effect. In such a scenario, the delta-sigma modulator 52 will require only minimal functionality.

Although the RF industry has rapidly progressed with regard to compact radio architectures, existing front-end components, such as power amplifiers, low noise amplifiers and filters still limit the bandwidth in dynamic range of these components. A single RF front-end capable of wide bandwidth sampling has been contemplated before, but the device technology was not sufficiently developed to allow the design and integration of a multi-function radio that would be suitable as a cellular handset. As discussed, an integrated front-end RF module would need 111-125 dB of dynamic range for 20 MHz of signal bandwidth. CMOS cannot come close to this requirement and is moving in the wrong direction. SiGe technology is still far away, and GaAs technology is getting closer, but still falls short.

To overcome these limitations, the present invention leverages three unique innovations as discussed above, namely, an inherently wideband architecture with direct sampling using delta-sigma modulators, highly linear based power amplifiers and input transconductor amplifiers, and tunable/programmable filters. Based on these innovations, some of the components of the architecture 30 will be fabricated in indium phosphide (InP) technologies to provide the desired performance and power handling and some of the components will be fabricated in the CMOS technology, which is lower cost. The present invention proposes that the low-power delta-sigma modulators 52 incorporate an InP DHBT design and fabrication processes and provide 200 GHz FMAX that provides sufficient head room to enable new feedback linearization techniques. Further, on the transmitter side, InP DHBT provides a system design flexibility over other technologies. The proposed software defined front-end transceiver module 44 is enabled by tightly integrating InP technology with silicon (Si) CMOS. Generally, those devices, components and devices that operate at the higher frequencies, such as 5.2 GHz, including the combiner 70, the LNTA 72, the filter 74, the power amplifier 64, etc., employ the InP technology and the components and devices that operate at the lower frequency, such as 1.3 GHz, employ the CMOS technology.

The modulators 52 will predominately be implemented in InP double heterojunction bipolar transistor (DHBT) technology where it is necessary to meet the challenging dynamic range requirements across a signal bandwidth of 20 MHz at frequencies up to 2.6 GHz. Backend processing of the receive data in the DSP 54 will be implemented in 40/45 nm CMOS. A combination of InP DHBT, 40/45 nm CMOS, and silicon on insulator (SOI) 180 nm R-CMOS will be used in the transmitter module 48. The SOI CMOS supports broader frequency tuning and the InP DHBT offers higher gain for improved linearity. The DWA circuit 184 and the transmit DAC 188 will be implemented in 45 nm CMOS for highest power efficiency.

In one implementation, CMOS technology is employed to realize the data modulation and dynamic element matching algorithms to achieve a low power realization. InP HBT technology is implemented in the DACs for a high speed operation and InP HBT or GaN HEMT technologies are employed to realize the power amplifier 64 for a large output power with high efficiency. In addition, the interleaving sigma-delta modulators can use the micro-bump technology discussed below.

A number of technologies allow the integration of the InP fabrication techniques and the CMOS fabrication techniques. A first enabling technology is an InP HBT technology having a 60 GHz FMAX that is sufficient only for channelized amplifier design. A second enabling technology is referred to as micro-bump integration technology that leverages CMOS and III-V material integration for megapixel imaging applications. InP HBT and RF-SOI CMOS fabrication can proceed in parallel without modification and represents the best cost value for high voltage CMOS technology and low parasitic SOI substrates.

Figure 13:
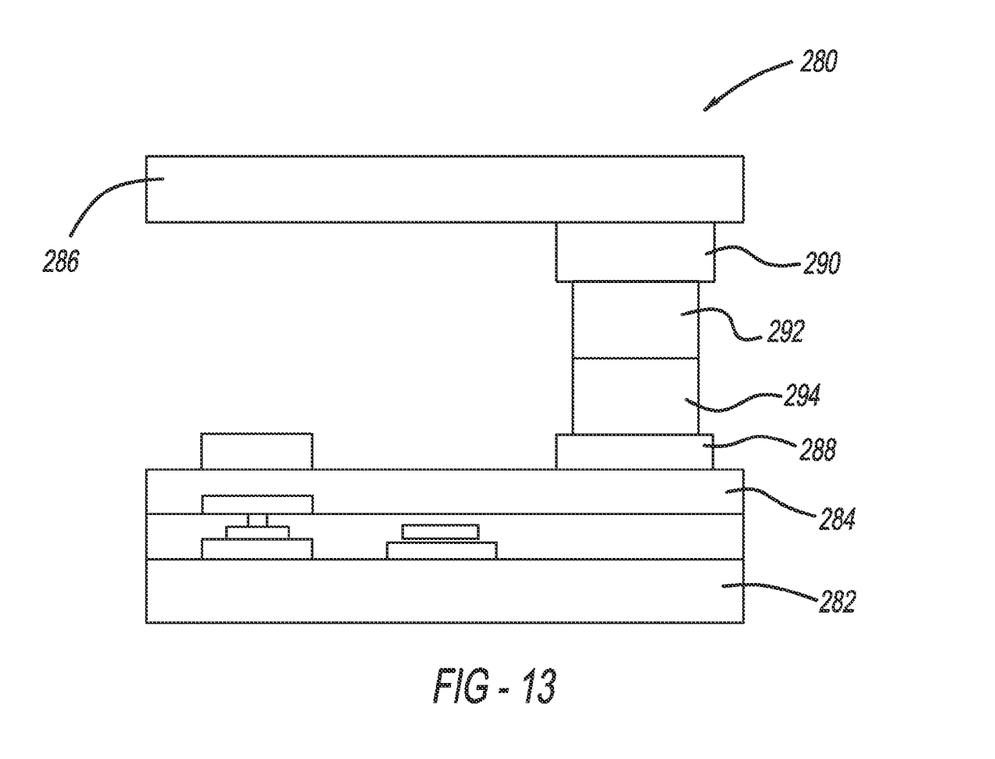
FIG. 13 is a profile view of a semiconductor device showing integration between CMOS and InP technologies.

FIG. 13 is a profile view of a semiconductor device 280 showing an integration between InP and CMOS technologies through a known micro-bump integration technique. The device 280 includes an InP substrate 282 on which is deposited InP device layers 284 and a CMOS substrate 286. A metal contact layer 288 is deposited on the device layers 284 and a metal contact layer 290 is deposited on the CMOS substrate 286. The substrates 282 and 286 are integrated together through a micro-bump 10 μm I/O pad layers 292 and 294 having a 20 μm pad pitch.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An RF transmitter module for a cellular radio, said transmitter module comprising:
a delta-sigma modulator including a plurality of interleaving dynamic element matching (DEM) circuits providing interleaved digital bits at a reduced clock rate;
an interleaver controller for controlling the DEM circuits so as to provide groups of the digital bits at different points in time;
a summation junction adding the groups of the digital bits to provide a continuous stream of the interleaved digital bits;
a digital-to-analog converter (DAC) for converting the stream of interleaved digital bits to an analog signal; and
a power amplifier for amplifying the analog signal.

2. The transmitter module according to claim 1 wherein a separate DEM circuit is provided for each bit from a digital signal processor.

3. The transmitter module according to claim 1 wherein the DAC is fabricated in indium phosphide (InP) heterojunction bipolar transistor (HBT) technologies.

4. The transmitter module according to claim 1 wherein the power amplifier is fabricated in indium phosphide (InP) heterojunction bipolar transistor (HBT) and gallium nitride (GaN) high electron mobility transistor (HEMT) technologies.

5. The transmitter module according to claim 1 wherein the cellular radio is a vehicle cellular radio.

6. An RF transmitter module for a cellular radio, said transmitter module comprising:
a delta-sigma modulator including a plurality of interleaving dynamic element matching (DEM) circuits providing interleaved digital bits at a reduced clock rate;
an interleaver controller for controlling the DEM circuits so as to provide groups of the digital bits at different points in time;
a plurality of digital-to-analog converters (DACs) each receiving the group of the digital bits from a separate one of the DEM circuits, each DAC converting the group of interleaved digital bits to an analog signal;
a summation junction adding the analog signal from each of the DACs to provide a combined analog signal; and
a power amplifier for amplifying the combined analog signal.

7. The transmitter module according to claim 6 wherein a separate DEM circuit is provided for each bit from a digital signal processor.

8. The transmitter module according to claim 6 wherein the DAC is fabricated in indium phosphide (InP) heterojunction bipolar transistor (HBT) technologies.

9. The transmitter module according to claim 6 wherein the power amplifier is fabricated in indium phosphide (InP) heterojunction bipolar transistor (HBT) and gallium nitride (GaN) high electron mobility transistor (HEMT) technologies.

10. The transmitter module according to claim 6 wherein the cellular radio is a vehicle cellular radio.

11. An RF transmitter module for a cellular radio, said transmitter module comprising:
a delta-sigma modulator including a plurality of interleaving dynamic element matching (DEM) circuits providing interleaved digital bits at a reduced clock rate;
an interleaver controller for controlling the DEM circuits so as to provide groups of the digital bits at different points in time;
a plurality of digital-to-analog converters (DACs) each receiving the group of the digital bits from a separate one of the DEM circuits, each DAC converting the group of interleaved digital bits to an analog signal;
a plurality of power amplifiers each receiving and amplifying the analog signal from a separate one of the DACs; and
a summation junction adding the analog signals from each of the power amplifiers.

12. The transmitter module according to claim 11 wherein a separate DEM circuit is provided for each bit from a digital signal processor.

13. The transmitter module according to claim 11 wherein the DAC is fabricated in indium phosphide (InP) heterojunction bipolar transistor (HBT) technologies.

14. The transmitter module according to claim 11 wherein the power amplifier is fabricated in indium phosphide (InP) heterojunction bipolar transistor (HBT) and gallium nitride (GaN) high electron mobility transistor (HEMT) technologies.

15. The transmitter module according to claim 11 wherein the cellular radio is a vehicle cellular radio.

16. An RF transmitter module for a cellular radio, said transmitter module comprising:
a delta-sigma modulator including a plurality of interleaving dynamic element matching (DEM) circuits providing interleaved digital bits at a reduced clock rate;
an interleaver controller for controlling the DEM circuits so as to provide groups of the digital bits at different points in time;
at least one digital-to-analog converter (DAC) for converting interleaved digital bits to an analog signal from one or more of the DEM circuits; and
at least one power amplifier for amplifying the analog signal.

17. The transmitter module according to claim 16 wherein a separate DEM circuit is provided for each bit from a digital signal processor.

18. The transmitter module according to claim 16 wherein the DAC is fabricated in indium phosphide (InP) heterojunction bipolar transistor (HBT) technologies.

19. The transmitter module according to claim 16 wherein the power amplifier is fabricated in indium phosphide (InP) heterojunction bipolar transistor (HBT) and gallium nitride (GaN) high electron mobility transistor (HEMT) technologies.

20. The transmitter module according to claim 16 wherein the cellular radio is a vehicle cellular radio.

* * * * *